United States Patent
Yoshida et al.

(10) Patent No.: US 6,362,434 B1
(45) Date of Patent: *Mar. 26, 2002

(54) MAGNETIC PREPREG, ITS MANUFACTURING METHOD AND PRINTED WIRING BOARD EMPLOYING THE PREPREG

(75) Inventors: Shigeyoshi Yoshida, Abiko; Mitsuharu Sato, Yokohama; Koji Kamei, Kawasaki, all of (JP)

(73) Assignee: Tokin Corporation, Miyagi (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/066,381
(22) PCT Filed: Sep. 4, 1997
(86) PCT No.: PCT/JP97/03101
    § 371 Date: Apr. 29, 1998
    § 102(e) Date: Apr. 29, 1998
(87) PCT Pub. No.: WO98/10626
    PCT Pub. Date: Mar. 12, 1998

(30) Foreign Application Priority Data

Sep. 5, 1996 (JP) ............................................. 8-235299

(51) Int. Cl.$^7$ .................................................. H05K 1/09
(52) U.S. Cl. .................... 174/256; 174/35 MS; 428/210
(58) Field of Search ................................. 174/255, 256, 174/35 R, 35 MS; 428/210

(56) References Cited

U.S. PATENT DOCUMENTS

| | | | | |
|---|---|---|---|---|
| 4,137,361 A | * | 1/1979 | Deffeyes et al. | 428/328 |
| 4,496,415 A | * | 1/1985 | Sprengling | 156/283 |
| 5,207,841 A | * | 5/1993 | Shigeta et al. | 148/307 |

* cited by examiner

Primary Examiner—Albert W. Paladini
(74) Attorney, Agent, or Firm—Hopgood, Calimafde, Judlowe & Mondolino LLP

(57) ABSTRACT

For improving a noise characteristic of a printed circuit board excellent in noise characteristic, a magnetic prepreg formed by impregnating a magnetic paint composed of soft magnetic powder and thermosetting resin into a glass cloth is used as a prepreg constituting the printed circuit board. It is preferable that the soft magnetic powder is metal powder being essentially flat. Further, it is preferable that a main component of the thermosetting resin is epoxy resin.

8 Claims, 3 Drawing Sheets

Fig. 4
(a)
(Prior Art)
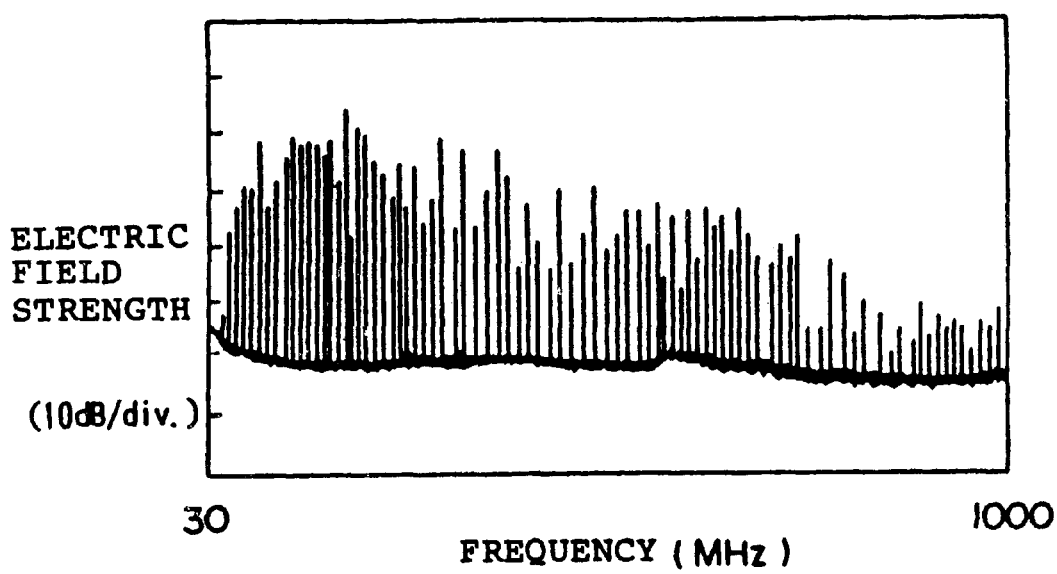
(b)
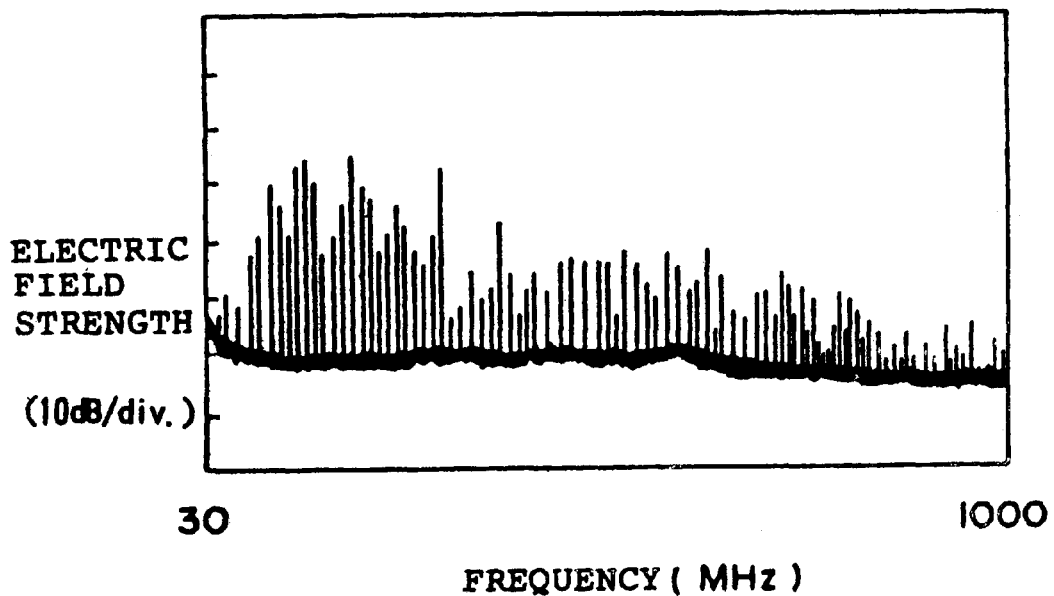

MAGNETIC PREPREG, ITS MANUFACTURING METHOD AND PRINTED WIRING BOARD EMPLOYING THE PREPREG

TECHNICAL FIELD

The present invention relates to a printed circuit board and, in particular, to a printed circuit board which suppresses electromagnetic interference caused by interference of undesired electromagnetic waves.

BACKGROUND ART

As is well known, a digital electronic device comprises a number of electronic components, such as a random access memory (RAM), a read-only memory (ROM), a microprocessor, and the like each of which comprises a number of logic elements. These electronic components are mounted on a printed circuit board having signal lines (wired conductors) wired around thereon. In recent digital electronic devices, the operation speed of the logic elements has been rapidly increased and further the reduction in weight, thickness, length and size of the device has also been highly advanced. Following this, the mounting density of the electronic components onto the printed circuit board has also been rapidly enhanced.

However, since a signal flowing in the logic elements goes with abrupt changes in voltage and current, the electronic component is a noise generation source which generates high frequency noise. The high frequency noise causes interactions cooperatively with crosstalk noise or noise due to impedance mismatch so as to induce malfunctions relative to other electronic components on the printed circuit board and adversely affect other systems. Further, following the high-density mounting of the electronic components onto the printed circuit board and the reduction in size of the electronic components, electrostatic coupling between the electronic components and between the signal lines is increased so that the electromagnetic interference is liable to occur in the. digital electronic device.

Conventionally, in the general printed circuit board used in the digital electronic device, when operation frequency of signals flowing through the logic elements and the signal lines is low, electromagnetic coupling between the signal lines such as electromagnetic induction generated in the printed circuit board is relatively small so that no problem is raised. However, as the operation frequency of the signals flowing through the logic elements and the signal lines becomes high, the electromagnetic coupling between the signal lines is increased so that the foregoing problems are raised.

Therefore, there has been proposed an electromagnetic wave shield circuit board of a structure in which the printed circuit board itself is provided with a shield layer, wherein undesired electromagnetic waves generated at the printed circuit board are screened by this electromagnetic wave shield layer. To be concrete, the foregoing electromagnetic wave shield circuit board has a structure wherein two circuit board surfaces are opposite to each other with the shield layer interposed therebetween. Here, the shield layer is formed of a conductor material which reflects the electromagnetic waves. Specifically, the screening of the electromagnetic waves by means of the shield layer aims to prevent invasion of the electromagnetic waves further inward therefrom by reflecting the electromagnetic waves incident thereupon. Accordingly, in the electromagnetic wave shield circuit board, a shield effect can be expected with respect to one circuit board surface confronting the opposite circuit board surface on the side where an electronic component to be a noise generation source is installed, while, with respect to the opposite circuit board surface on the side where the electronic component to be the noise generation source is installed, undesired radiation is generated due to the reflection of the electromagnetic waves is generated. As a result, there have been not a few cases wherein secondary electromagnetic coupling is promoted at the opposite circuit board surface on the side of the noise generation source. Further, in a floating digital electronic device, since the shield layer works as an antenna, secondary radiant noise is possibly generated from the shield layer.

For solving such problems, in JP-A-8-46386 (herein-after referred to as the prior art), the applicant of this application has offered a printed circuit board which does not spoil a shield effect of an electromagnetic wave shield circuit board and thus has a sufficient shield effect against transmittance of the electromagnetic waves, while, with respect to reflection of the electromagnetic waves, does not promote electromagnetic coupling at least due to reflection. In the printed circuit board disclosed in this prior art, a printed circuit base member having wired conductors on one side or both sides thereof comprises a conductive support and insulating soft magnetic layers provided on both sides of the conductive support. The insulating soft magnetic layer includes soft magnetic powder and an organic binding agent. Further, the insulating soft magnetic layer may have a dielectric layer on at least one side thereof. This dielectric layer includes dielectric powder and an organic binding agent. Alternatively, the foregoing insulating soft magnetic layer may include the soft magnetic powder, the dielectric powder and the organic binding agent. It is preferable that the foregoing soft magnetic powder is powder being flat and/or needle-shaped.

On the other hand, a stacked body (electromagnetic interference suppressing layer) of the conductive support and the insulating soft magnetic body to be used in the foregoing printed circuit base member is produced, for example, in the following manner: Copper paste is formed into films on both sides of a polyimide film of 75 μm by a doctor blade process to obtain a conductive support. Thereafter, soft magnetic paste is applied onto both sides of the conductive support by the doctor blade process to form insulating soft magnetic layers, which are then subjected to curing at 85° C. for 24 hours to obtain a printed circuit base member.

Conventionally, a prepreg constituting a printed circuit board is composed of resin and glass cloth. For example, the conventional prepreg is produced by impregnating thermosetting resin into a glass cloth and then drying and half-curing it.

However, in the printed circuit board disclosed in the prior art, there is a problem that it is difficult to form the insulating soft magnetic layers. On the other hand, since the conventional prepreg is constituted of only the resin and the glass cloth, the radiant noise can not be absorbed.

Therefore, a theme of the present invention is to provide a magnetic prepreg which can absorb the radiant noise.

Another theme of the present invention is to provide a method of producing the foregoing magnetic prepreg.

Still another theme of the present invention is to provide a printed circuit board using the foregoing magnetic prepreg.

DISCLOSURE OF THE INVENTION

For achieving the foregoing themes, according to a first aspect of the present invention, there is obtained a magnetic prepreg formed by impregnating a magnetic paint composed of soft magnetic powder and thermosetting resin into a glass cloth. In the foregoing magnetic prepreg, it is preferable that the soft magnetic powder is metal powder being essentially flat. Further, it is preferable that a main component of the thermosetting resin is epoxy resin.

According to a second aspect of the present invention, there is obtained a method of producing a magnetic prepreg characterized in that a magnetic paint composed of soft magnetic powder and thermosetting resin is impregnated into a glass cloth, then dried and further cured into a half-cured state. In this method, it is preferable that a magnetic alignment procedure is carried out in an in-face orientation of the glass cloth after impregnating the magnetic paint into the glass cloth.

According to a third aspect of the present invention, there is obtained a printed circuit board using the foregoing magnetic prepreg, which comprises a normal prepreg composed of resin and glass cloth and at least one of the magnetic prepreg stacked to at least one side of the normal prepreg via a wiring pattern.

BRIEF DESCRIPTION OF THE DRAWINGS

FIG. 4 is graphs showing frequency characteristics of electric field strengths with respect to printed circuit boards according to the prior art and the present invention, wherein (a) shows a frequency characteristic of the electric field strength of the conventional printed circuit board and (b) shows a frequency characteristic of the electric field strength of the printed circuit board according to the present invention.

BEST MODE FOR CARRYING OUT THE INVENTION

Now, the present invention will be explained in detail with reference to the drawings.

Figure 1:
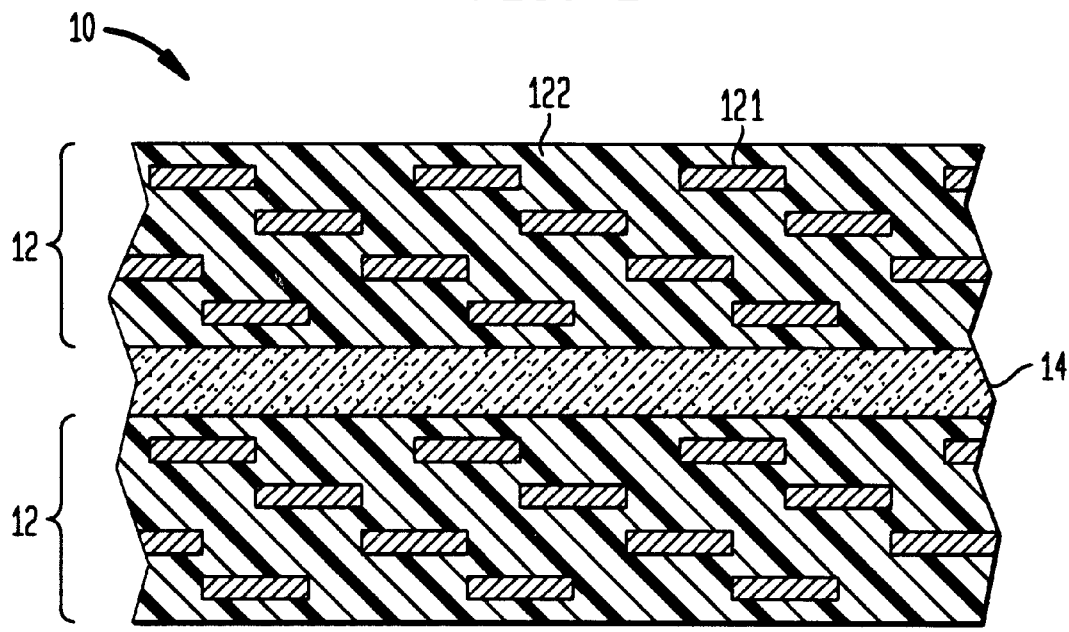
FIG. 1 is a sectional view showing a magnetic prepreg according to one embodiment of the present invention .

Referring to FIG. 1, a magnetic prepreg 10 according to one embodiment of the present invention is formed by impregnating a magnetic paint 12 composed of soft magnetic powder 121 and thermosetting resin 122 into a glass cloth 14. It is preferable that the soft magnetic powder 121 is metal powder being substantially flat. Further, it is metal powder being substantially flat. Further, it is preferable that a main component of the thermosetting resin 122 is epoxy resin.

As the thermosetting resin 122, (poly) urethane resin, phenol resin, amide resin, imide resin or the like can be cited other than the epoxy resin. As the soft magnetic powder 12, an Fe—Al—Si alloy (this is called Sendust (trademark)) or an Fe—Ni alloy (Permalloy) having a large high frequency permeability can be cited as a typical material thereof. The soft magnetic powder 12 is used by being finely powdered and by oxidizing surface portions thereof. It is preferable that an aspect ratio of the soft magnetic powder 12 is sufficiently large (for example, approximately not less than 5:1). By rendering substantially flat the shape of the soft magnetic powder 12, undesired radiant noise can be absorbed and suppressed more efficiently. This is because if the soft magnetic powder 12 is essentially flat in shape and oriented/aligned in an in-surface direction in the magnetic prepreg, a shape anisotropy appears so that a complex permeability based on a magnetic resonance is increased at a high frequency region.

As the foregoing magnetic paint 12, one shown in Table 1 below can be used.

TABLE 1

| | |
|---|---|
| Flat soft magnetic fine powder | 90 weight parts |
| Composition: Fe—Al—Si alloy | |
| Mean particle diameter: 30 μm | |
| Aspect ratio: about 10 | |
| Thermosetting resin | |
| Brominated epoxy resin | 15 weight parts |
| O-cresol novolak type epoxy resin | 5 weight parts |
| Dicyandiamide | 0.8 weight parts |
| Dimethyl benzylamine | 0.06 weight parts |
| Solvent | |
| Mixture of MEK, DMF and methyl cellosolve | 40 weight parts |

Figure 2:
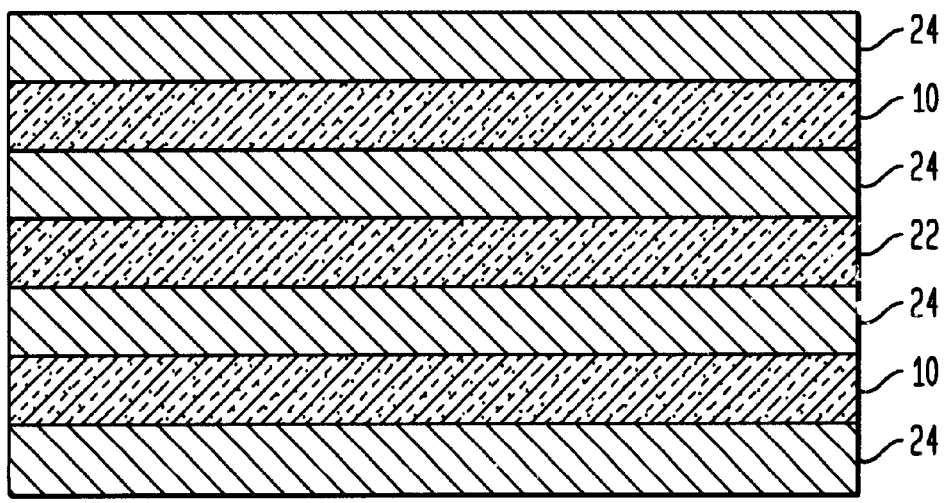
FIG. 2 is a built-up sectional view showing a printed circuit board, using the magnetic prepreg shown in FIG. 1, in a disassembled state.

FIG. 2 shows a printed circuit board 20 using the magnetic prepreg 10 shown in FIG. 1. The shown printed circuit board 20 is formed by sandwiching an internal layer member 22 being a normal prepreg composed of resin and glass cloth, with a pair of the magnetic prepregs 10 from both sides thereof via copper foils 24, and covering the exposed surfaces of the magnetic prepregs 10 with copper foils 24. The copper foils 24 each have a thickness of, for example, about 0.035 mm and are formed with a wiring pattern. The internal layer member 22 and the magnetic prepregs 10 are formed with through holes, not shown, and the copper foils (wiring patterns) 24 are electrically connected to each other via the through holes.

Now, referring to FIG. 3, a method of producing the magnetic prepreg 10 and the printed circuit board 20 will be explained.

Figure 3:
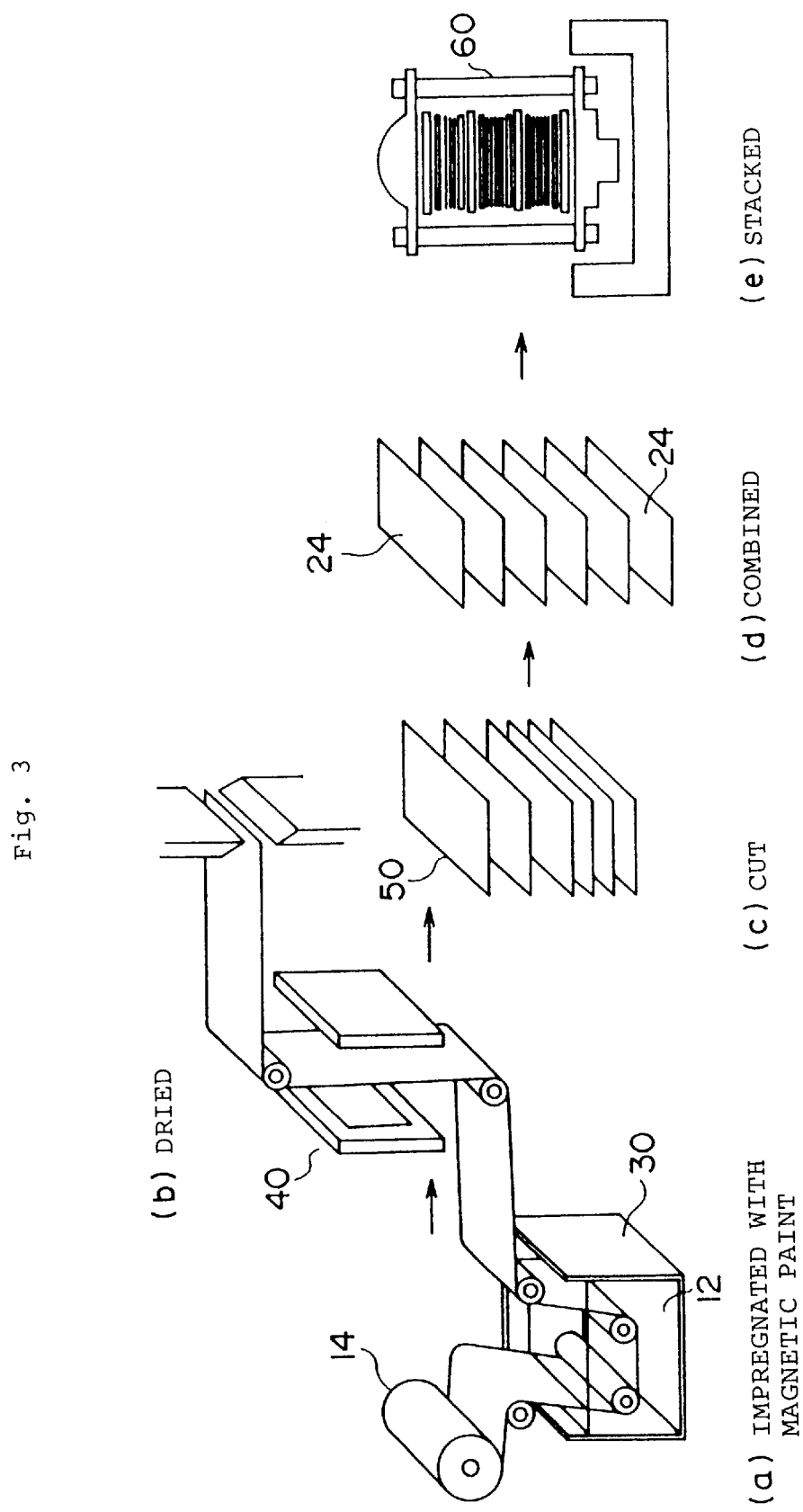
FIG. 3 is a diagram showing production processes of the magnetic prepreg shown in FIG. 1 and the printed circuit board shown in FIG. 2.

First, as shown in FIG. 3 at (a), a web-like glass cloth 14 is passed through the inside of a vessel 30 containing the magnetic paint 12 so as to be impregnated with the magnetic paint 12 of a necessary amount. It is preferable to carry out a magnetic alignment procedure by means of, such as, passing the glass cloth 14, after having been impregnated with the magnetic paint 12, through a solenoid magnet (not shown).

Subsequently, as shown in FIG. 3 at (b), the glass cloth 14 impregnated with the magnetic paint 12 is passed through a drier 40 whose temperature is uniformly controlled, so as to advance a resin reaction. After the drying, as shown in FIG. 3 at (c), it is cut to required dimensions. The cut one is called a resin cloth 50. In this manner, the magnetic prepreg 10 (FIG. 1) is produced.

Subsequently, as shown in FIG. 3 at (d), a fixed number of the resin cloths 50, the internal layer member 22 (FIG. 2) and the copper foils 24 are combined and applied with a stainless plate (not shown). Then, as shown in FIG. 3 at (e), the material applied with the stainless plate is subjected to press/formation in a multistage press machine 60. In this manner, the printed circuit board 20 (FIG. 2) is produced.

FIG. 4 shows frequency characteristics of electric field strengths (noise spectra) of the printed boards according to the prior art and the present invention. In FIG. 4, the axis of abscissa represents frequency (Hz), while the axis of ordinate represents electric field strength (10 dB/div.). In FIG. 4, (a) shows a frequency characteristic of the electric field strength of the conventional printed board without the magnetic prepreg 10, while (b) in FIG. 4 shows a frequency characteristic of the electric field strength of the printed board 20 using the magnetic prepreg 10 according to the present invention. The printed circuit boards formed with the same wiring patterns were used with respect to the prior art and the present invention.

As evident from FIG. 4, the electric field strengths are relatively lower with respect to the printed circuit board according to the present invention (FIG. 4 at (b)) as compared with the conventional printed circuit board (FIG. 4 at (a)). Specifically, it is appreciated that the printed circuit board according to the present invention can reduce the radiant noise.

While the present invention has been explained by citing some embodiments, it is needless to say that the present invention is not limited to the foregoing embodiments, but can be modified in various ways without departing from the gist of the present invention. For example, it is a matter of course that the materials of the soft magnetic powder or the thermosetting resin are not limited to those of the embodiments. Further, it is a matter of course that the number of the stacked layers of the magnetic prepreg constituting the printed circuit board is not limited to that of the embodiments.

Industrial Applicability

As described above, according to the present invention, by using the magnetic prepreg formed by impregnating the magnetic paint composed of the soft magnetic powder and the thermosetting resin into the glass cloth, the printed circuit board excellent in noise characteristic can be obtained.

What is claimed is:

1. A magnetic prepreg formed by impregnating a magnetic paint composed of soft magnetic powder and thermosetting resin into a glass cloth, wherein said soft magnetic powder is metal powder which is essentially flat and which is impregnated in said prepreg is oriented/aligned in an in-surface direction.

2. The magnetic prepreg as recited in claim 1, characterized in that a main component of said thermosetting resin is epoxy resin.

3. A printed circuit board using the magnetic prepreg as recited in as in claims 1 or 2, said printed circuit board comprising said prepreg composed of resin and glass cloth and at least one of said magnetic prepreg stacked to at least oneside of another prepreg via a wiring pattern.

4. A magnetic prepreg as in claim 1, formed by the process of: passing a web-like glass cloth into a vessel containing a magnetic paint comprising a mixture of flat soft magnetic powder and a thermosetting resin and thereby produce an impregnated glass cloth; magnetically aligning said soft flat magnetic powder impregnated in said glass cloth and thereby produce an in-surface orientation and alignment of said flat magnetic powder; drying and curing said pint in said impregnated glass cloth; and cutting said impregnated glass cloth to produce a plurality of prepregs.

5. The magnetic prepreg of claim 4, wherein said flat magnetic powder has an aspect ratio of at least 5:1.

6. The magnetic prepreg of claim 4, wherein said soft flat magnetic powder is selected from the group consisting of an Fe—Al—Si alloy and an Fe—Ni alloy.

7. The magnetic prepreg of claim 6, wherein said flat magnetic powder has an aspect ratio of at least 5:1.

8. The magnetic prepreg of claim 1, wherein said prepreg has a property for suppressing radiant noise of 30–1000 MHz.

\* \* \* \* \*